United States Patent [19]

Prabhu

[11] Patent Number: 5,124,282
[45] Date of Patent: Jun. 23, 1992

[54] GLASSES AND OVERGLAZE INKS MADE THEREFROM

[75] Inventor: Ashok N. Prabhu, East Windsor, N.J.

[73] Assignee: David Sarnoff Research Center, Inc., Princeton, N.J.

[21] Appl. No.: 616,498

[22] Filed: Nov. 21, 1990

[51] Int. Cl.⁵ ................................................ C03C 8/04
[52] U.S. Cl. .................................. 501/5; 501/8; 501/26; 501/69; 501/70; 501/73; 428/426; 428/432
[58] Field of Search .................. 501/26, 73, 69, 70, 501/5, 8; 428/426, 432

[56] References Cited

U.S. PATENT DOCUMENTS

| | | | |
|---|---|---|---|
| 4,376,725 | 3/1983 | Prabhu et al. | 252/512 |
| 4,624,934 | 11/1986 | Kokubu et al. | 501/26 X |
| 4,788,163 | 11/1988 | Hang et al. | 501/17 |
| 4,808,673 | 2/1989 | Hang et al. | 524/413 |
| 4,808,770 | 2/1989 | Prabhu et al. | 501/73 X |
| 4,816,615 | 3/1989 | Prabhu et al. | 501/73 X |
| 4,874,550 | 10/1989 | Prabhu et al. | 501/73 X |
| 4,880,567 | 11/1989 | Prabhu et al. | 501/73 X |
| 4,997,795 | 3/1991 | Hang et al. | 501/26 X |

*Primary Examiner*—Karl Group
*Attorney, Agent, or Firm*—William J. Burke

[57] ABSTRACT

A novel devitrifying glass comprising, in weight percent, from 5–15% of zinc oxide, from 10–18% of magnesium oxide; from 15–20% of calcium oxide; from 6–14% of barium oxide; from 15–20% of aluminum oxide and from 30–40% of silicon dioxide. The glasses are thermally matched to alumina substrates. The glasses form overglaze thick film inks when admixed with an organic vehicle that are useful as protective coatings for alumina substrates and multilayer printed circuits.

9 Claims, 8 Drawing Sheets

GLASSES AND OVERGLAZE INKS MADE THEREFROM

This invention relates to novel devitrifying glasses and to overglaze inks made therefrom. More particularly, this invention relates to zinc-magnesium-barium-aluminosilicate devitrifying glasses containing calcium oxide, which glasses are thermally matched to alumina substrates.

BACKGROUND OF THE INVENTION

Glass overglaze inks are used to protect printed circuit board elements and composites. Such overglaze inks must be able to form high density films compatible with the printed circuit board substrate; must be able to be fired in air and/or nitrogen to a temperature of about 600°-900° C.; must be chemically resistant to acidic or basic environments; must be capable of providing good hermeticity to the cofired substrate having elements thereon; and must be able to withstand repeated temperature cycling from room temperature to about 400° C without cracking or peeling. Further, the fired overglaze film must have thermal expansion characteristics similar to the printed circuit board substrate.

In copending application Ser. No. 07/455,113 filed Dec. 22, 1989 entitled "DEVITRIFYING GLASSES AND DIELECTRIC INKS MADE THEREFROM", glass compositions suitable for high density dielectric inks were disclosed. The glasses in these inks contain from about 15 to about 23% by weight of zinc oxide; from about 7 to about 11% by weight of magnesium oxide; from about 14 to about 17% by weight of barium oxide; from about 9 to about 16% by weight of aluminum oxide; from 0 to about 2% by weight of phosphorus pentoxide; from 0 to about 3% by weight of zirconium silicate; and from about 35 to about 50% by weight of silicon oxide. These glasses are useful in making printed circuit boards in which the substrates are silicon because the thermal coefficients of expansion of the glasses are closely matched to that of silicon. However, it is also desirable to employ alumina as a printed circuit board substrate. Alumina has a higher coefficient of thermal expansion than silicon, and the above glasses are not thermally matched to alumina substrates. When an overglaze glass has a thermal coefficient of expansion that is lower than the substrate, the substrate will bend upon firing and become distorted.

Thus a devitrifying glass that can form an ink having good overglaze properties and that is thermally matched to alumina substrates has been sought.

SUMMARY OF THE INVENTION

We have found novel zinc-magnesium-barium-calcium-containing aluminosilicate devitrifying glasses which have a thermal coefficient of expansion closely matched to that of alumina and can form excellent overglaze inks. These glasses are made from zinc oxide, magnesium oxide, calcium oxide, barium oxide, aluminum oxide and silicon dioxide.

The glasses can be admixed with a suitable organic vehicle to form an ink composition which, when fired, can form protective films for printed circuit boards. The ink compositions can be varied to control the thermal expansion characteristics for various substrates.

DETAILED DESCRIPTION OF THE INVENTION

The novel glasses and inks of the invention are useful in making multilayer integrated circuit boards and structures. The glasses can be admixed with an organic vehicle to form an ink that is compatible with alumina substrates and other substrates, e.g., ceramics, that have similar thermal expansion characteristics.

The glass frit of the invention comprises from about 5 to 15% by weight of zinc oxide, preferably about 10%; from about 10 to about 18% by weight of magnesium oxide, preferably about 12-14.5%; from about 15 to about 20% by weight of calcium oxide, preferably about 16-18.5%; from about 6 to about 14% of barium oxide, preferably about 10%; from about 15 to 20% by weight of aluminum oxide, preferably about 16%; and from about 30 to about 40% by weight of silicon dioxide, preferably about 31 to 36%.

The glass frits are conventionally prepared by finely dividing the various oxides, mixing them in the desired proportions and melting the oxides at temperatures from about 1450°-1600° C. The glasses are then quenched and processed into powders, called glass frits.

Overglaze inks can be prepared from the above glasses by mixing the devitrifying glass frit and a suitable organic vehicle. The organic vehicles suitable herein are solutions of resin binders, such as cellulose derivatives, e.g., ethyl cellulose, synthetic resins such as polyacrylates, polyesters, polyolefins and the like, in a suitable solvent. Suitable solvents are known and include pine oil, terpineol, butyl carbitol acetate, 2,2,4-trimethyl-1,3-pentanediol monoisobutyrate, available from Texas Eastman Company under the trademark Texanol, and the like. The organic solvent can also contain about 0.5 to about 10 percent by weight of a suitable surfactant, such as oleylamine, available as Armeen O or a high molcular weight N-alkyl-1,3-diaminopropane dioleate, available as Duomeen TDO, both from AKZO Chemie America.

The resin binders can be used singly or as mixtures. If the viscosity needs to be adjusted, suitable viscosity modifiers can also be added to the organic vehicle, such as Thixatrol, a castor oil derivative available from NL Industries.

The inks may contain other ingredients, such as ceramic or other fillers to adjust the thermal expansion match between the glass frit and the substrate to be employed. For example, if a higher coefficient of expansion is desired, the glass can be mixed with magnesium silicate ($Mg_2SiO_4$); if a lower coefficient of expansion is desired, the glass can be mixed with zinc silicate ($Zn_2SiO_4$).

To prepare the subject inks, the glass frit and optionally other ingredients, are ground to a particle size of from about 1-5 micrometers and combined with the organic vehicle to form the ink. The solids content can vary from about 70 to about 85% of the glass and from about 15 to 30% of the resin binder. The organic vehicles give screen printing properties to the inks and are chosen to burn off cleanly in nitrogen or air at peak temperatures of about 850°-950° C. without leaving carbonaceous residues. The inks can be prepared from one or more glass frits of the invention, and other devitrifying glasses can also be added to vary and control the thermal match to the desired substrate. Preferably at least about 20% of the glass of the invention is employed in the subject inks if the substrate is alumina, but various glasses in almost any ratio can be employed, depending on the substrate to be utilized.

The inks of the invention are applied to the desired substrate by conventional means such as screen printing, brushing, spraying and the like. Because of the high softening points of the present glasses, they remain porous to temperatures in excess of 600° C., thus allowing the carbonaceous material of the organic vehicle of the inks to be cleanly burned off, producing clear films.

When the present inks are employed as overglaze inks, several layers can be applied to minimize the formation of pinholes.

After the ink is applied to the substrate or circuit, it is dried in air at 100°-25° C. and fired in nitrogen to form a protective layer.

The invention will be further illustrated in the following Examples, but the invention is not meant to be limited to the details described therein. In the Examples, parts and percentages are by weight.

EXAMPLE 1

The following oxide powders were admixed, melted at 1600° C. and the resultant glass quenched on counter rotating rollers:

| Constituents | Percent |
| --- | --- |
| ZnO | 10.00 |
| MgO | 12.00 |
| CaO | 16.00 |
| BaO | 10.00 |
| $Al_2O_3$ | 16.00 |
| $SiO_2$ | 36.00 |

EXAMPLE 2

The following glass was prepared following the procedure of Example 1

| Constituents | Percent |
| --- | --- |
| ZnO | 10.00 |
| MgO | 14.22 |
| CaO | 18.22 |
| BaO | 10.00 |
| $Al_2O_3$ | 16.00 |
| $SiO_2$ | 31.56 |

COMPARATIVE EXAMPLE

A glass was prepared as in Example 1 made from the following oxides:

| Constituents | Percent |
| --- | --- |
| ZnO | 16.40 |
| MgO | 8.84 |
| BaO | 16.98 |
| $Al_2O_3$ | 16.00 |
| $SiO_2$ | 41.78 |

The glasses as prepared above were made into thick film inks by grinding the glass, admixing the glass particles with an organic vehicle, and mixing on a three roll mill. The inks were screen printed onto alumina substrates and fired in nitrogen at temperatures from 850°-950° C.

EXAMPLE 3

An overglaze ink was prepared as follows:

| Constituents | Percent |
| --- | --- |
| Glass of Example 1 | 76.63 |
| 6 Wt % ECT-100 in Texanol | 15.33 |
| Duomeen TDO | .38 |
| Texanol | 7.66 |

Figure 1:
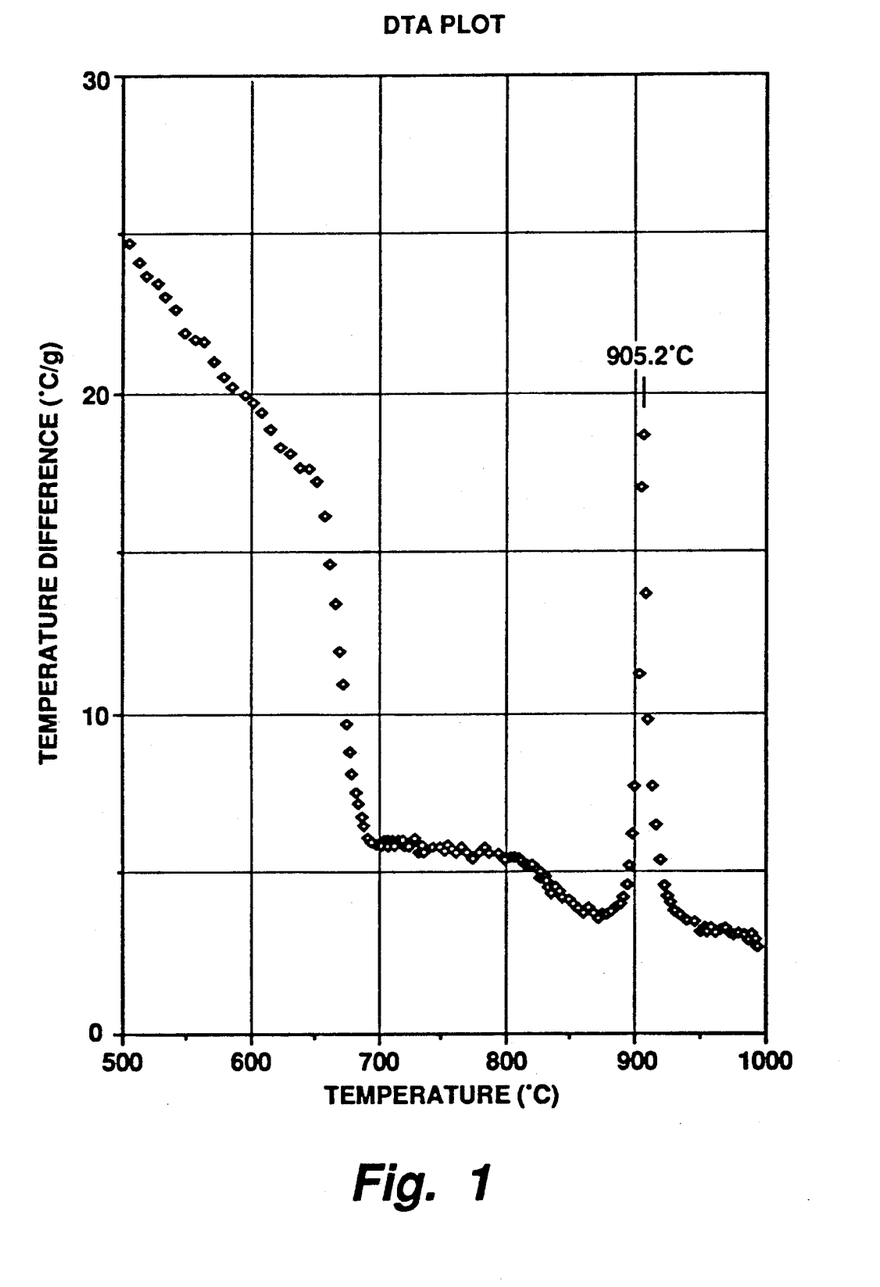
FIG. 1 is a DTA plot of an ink of the invention.

FIG. 1 is a Differential Thermal Analysis (DTA) plot of the temperature difference in degrees C/g versus temperature of the ink. It can be seen that the glass begins to rapidly crystallize at 905.2° C. Since the slope of the crystallinity curve is very steep, little crystallization takes place at temperatures less than about 850° C.

Figure 2:
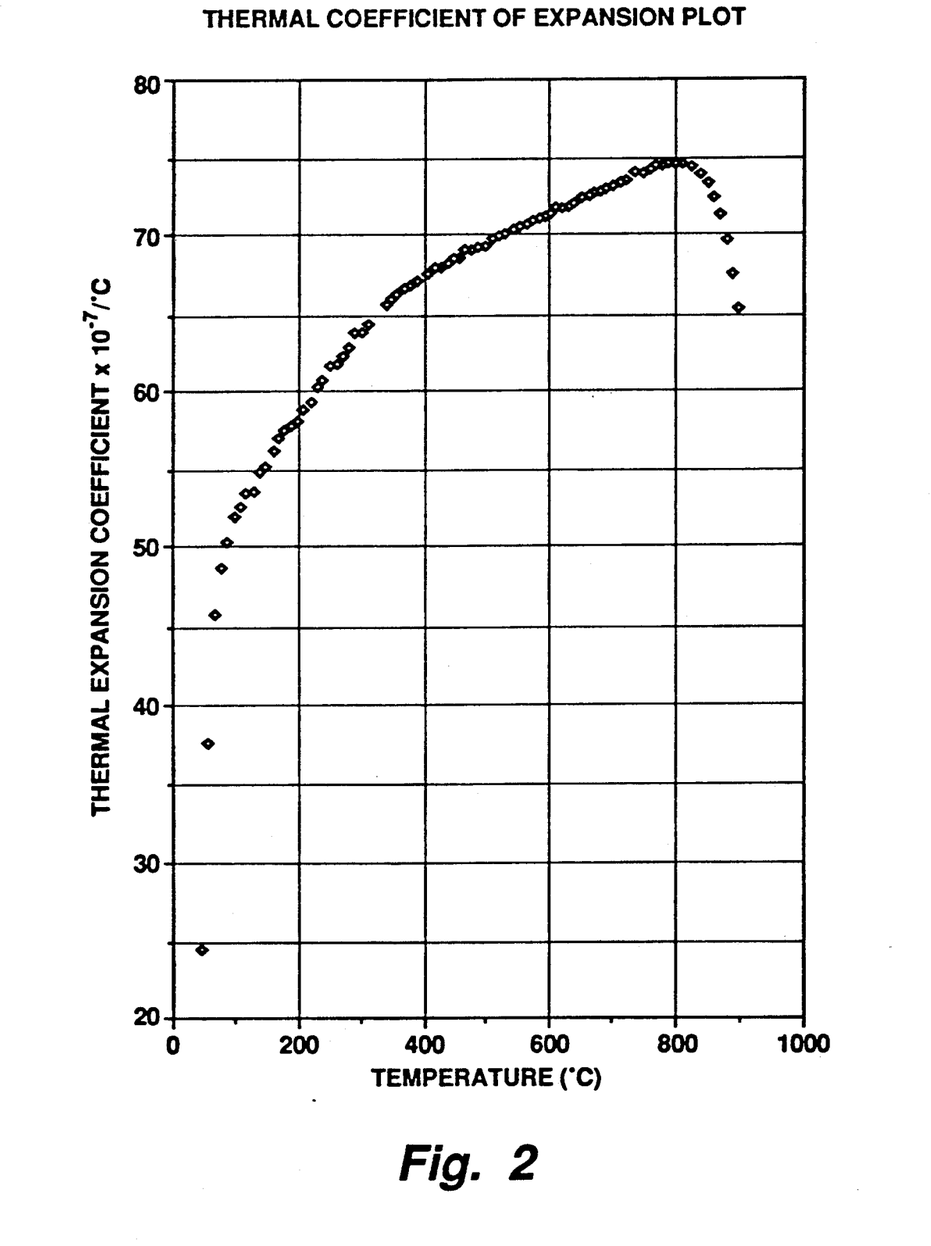
FIG. 2 is a thermal coefficient of expansion plot of an ink of the invention.
Figure 3:
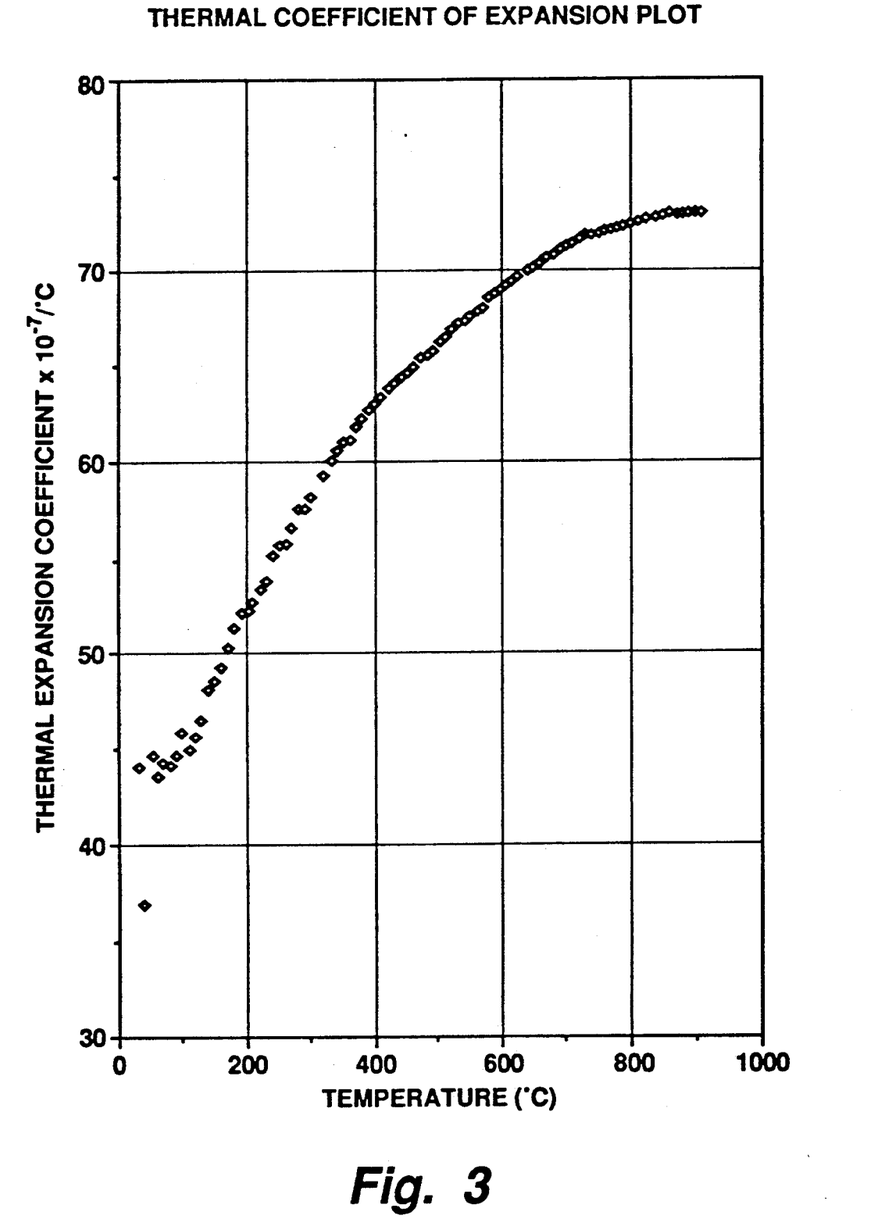
FIG. 3 is a thermal coefficient of expansion plot of an alumina substrate.

FIG. 2 is a coefficient of expansion plot of thermal coefficient of expansion $\times 10^{-7}/°$ C. versus temperature. At 800° C. the coefficient of expansion of this ink is about $75 \times 10^{-7}/°C$. As can be seen by referring to FIG. 3, a thermal coefficient of expansion plot for alumina, the thermal match at this temperature is very close between the glaze and the alumina substrate.

The crystal phases obtained by pressing the glass powders and furnace firing at 900° C. were anorthite $(CaAl_2Si_2O_8)$, gehlenite $(Ca_2Al_2SiO_7)$, willemite $(Zn_2SiO_4)$ and forsterite $(Mg_2SiO_4)$.

The above inks were coated onto alumina substrates to a of about 2-5 mils and fired at 900° C. The substrate remained straight, the glazed surface was clean and clear and free of pinholes.

EXAMPLE 4

Following the procedure of Example 3, the following overglaze ink composition was prepared:

| Constituents | Percent |
| --- | --- |
| Glass of Example 2 | 43.79 |
| Glass of Comparative Example | 32.84 |
| 6 Wt % ECT-100 in Texanol | 15.33 |
| Duomeen TDO | .38 |
| Texanol | 7.66 |

Figure 4:
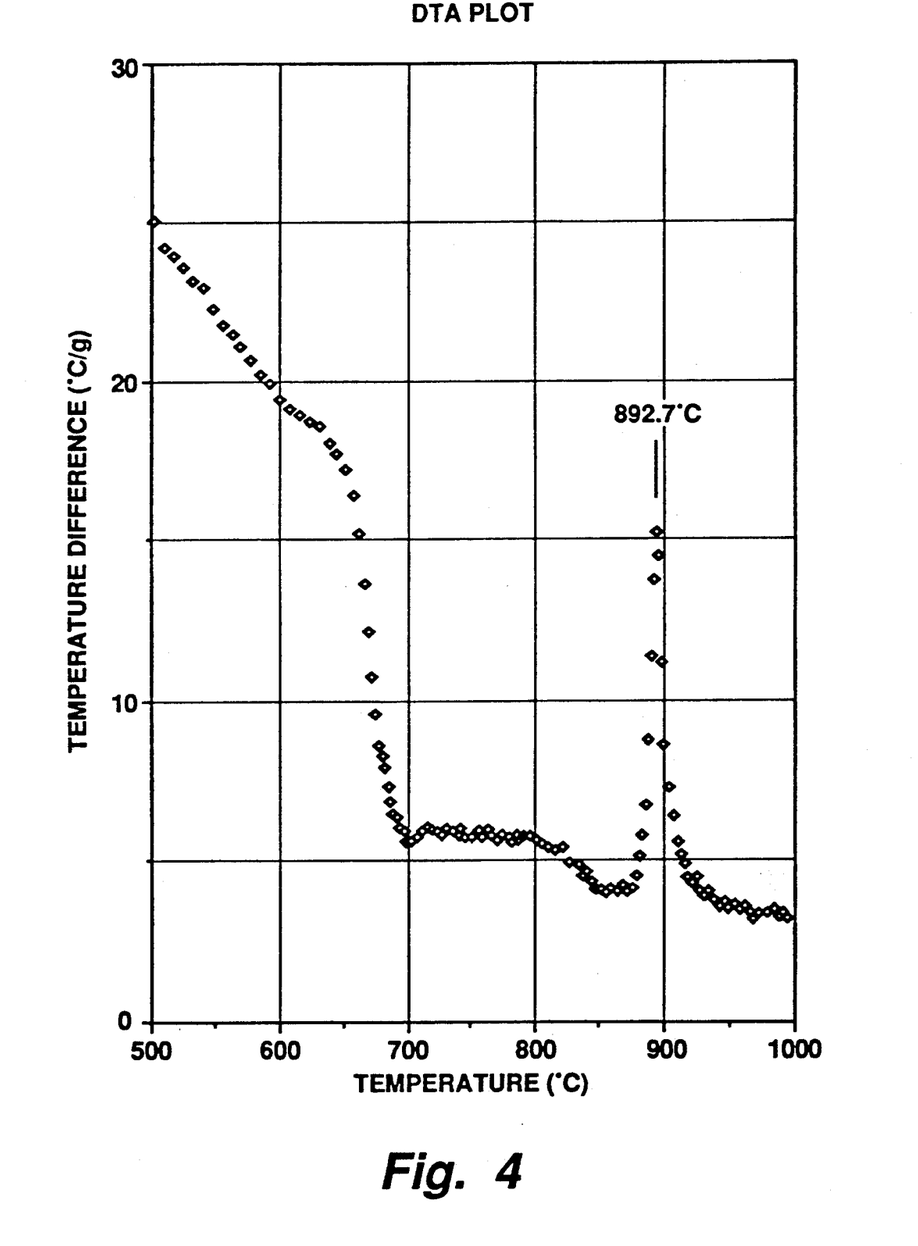
FIG. 4 is a DTA plot of another ink of the invention.

FIG. 4 is a DTA plot of this ink. Again a very steep crystallinity curve can be seen, showing a rapid crystallization taking place at a somewhat lower temperature of 892.7° C.

Figure 5:
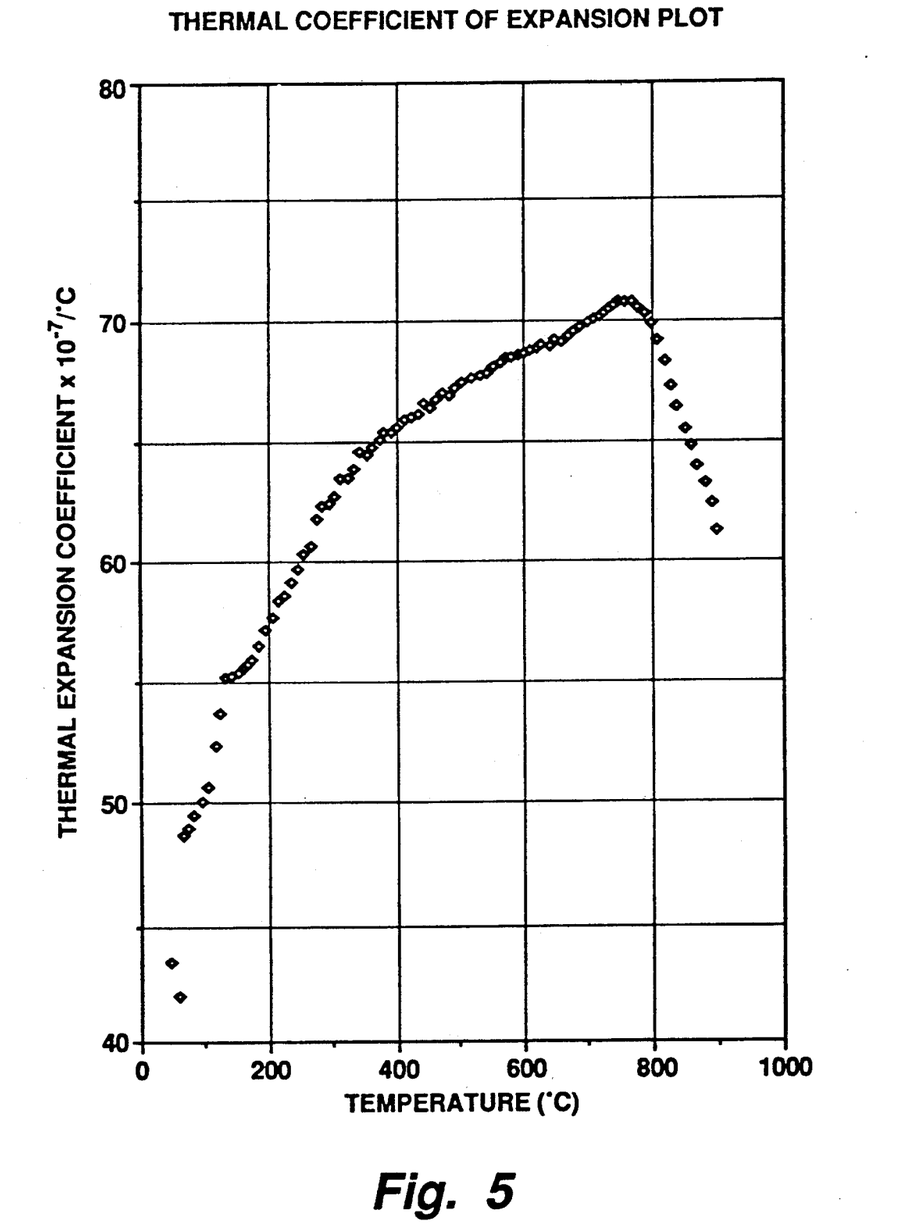
FIG. 5 is a thermal coefficient of expansion plot of the ink of FIG. 4.

FIG. 5 is a thermal coefficient of expansion plot for this ink. It shows a thermal coefficient of expansion of about $70 \times 10^{-7}/°$ C. at a temperature of 800° C. Again, the thermal match to alumina is very close.

The principal crystal phases obtained on firing at 900° C. were the same as for Example 4.

EXAMPLE 5

Following the procedure of Example 3, the following overglaze ink composition was prepared:

| Constituents | Percent |
| --- | --- |
| Glass of Example 1 | 49.26 |
| Glass of Example 2 | 27.36 |
| 6 Wt % ECT-100 in Texanol | 15.33 |
| Duomeen TDO | .38 |
| Texanol | 7.67 |

Figure 6:
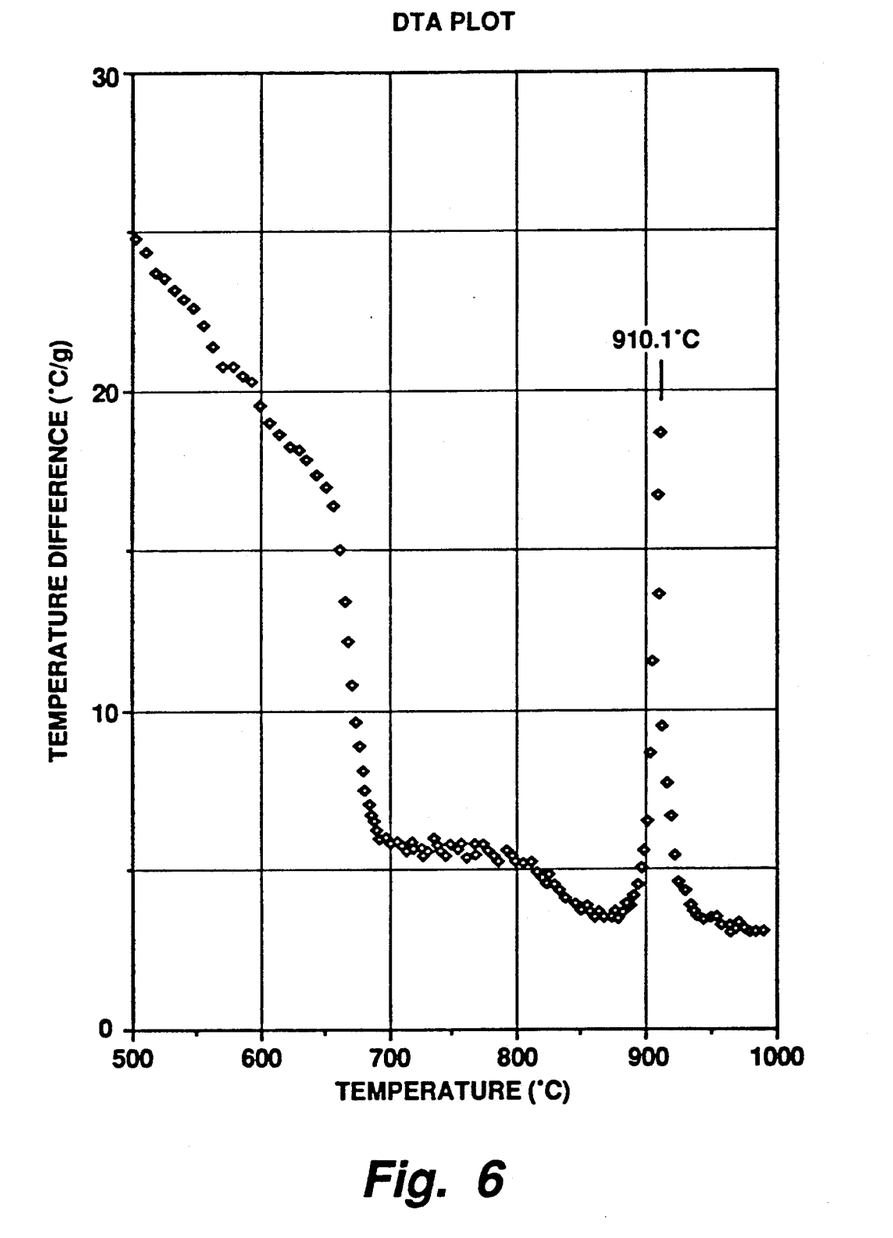
FIG. 6 is a DTA plot of another ink of the invention.

FIG. 6 is a DTA plot of this ink. This ink has a higher crystallization temperature of 910.1° C. When fired at 900° C., this glass remains essentially amorphous.

Figure 7:
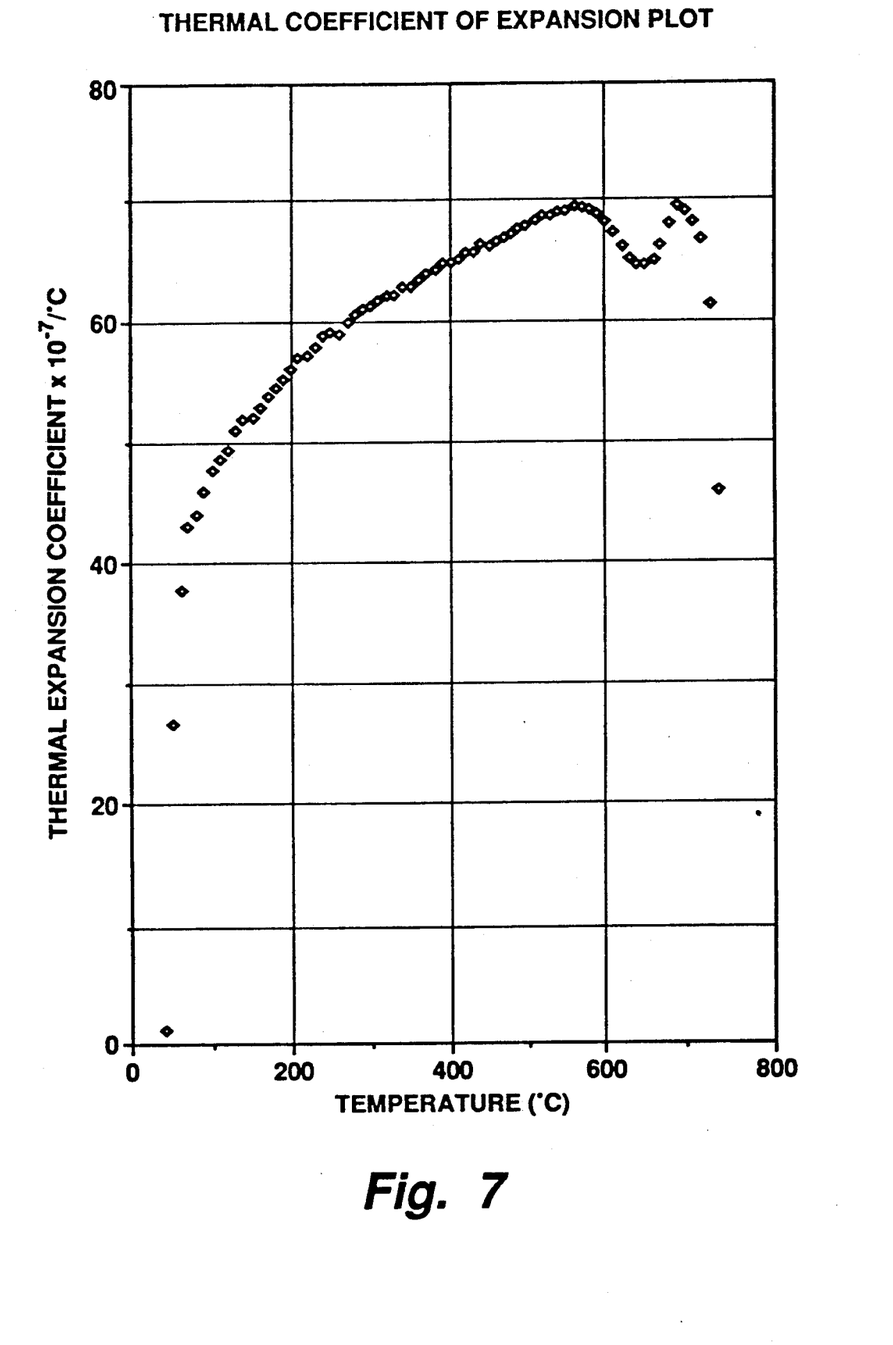
FIG. 7 is a thermal coefficient of expansion plot of the ink of FIG. 6.

FIG. 7 is a thermal coefficient of expansion plot for this ink. It can be seen that at about 700° C. the thermal expansion coefficient is $70 \times 10^{-7}/°$ C.

COMPARATIVE EXAMPLE 2

An ink was made as in Example 3 using the glass of Comparative Example 1 alone.

Figure 8:
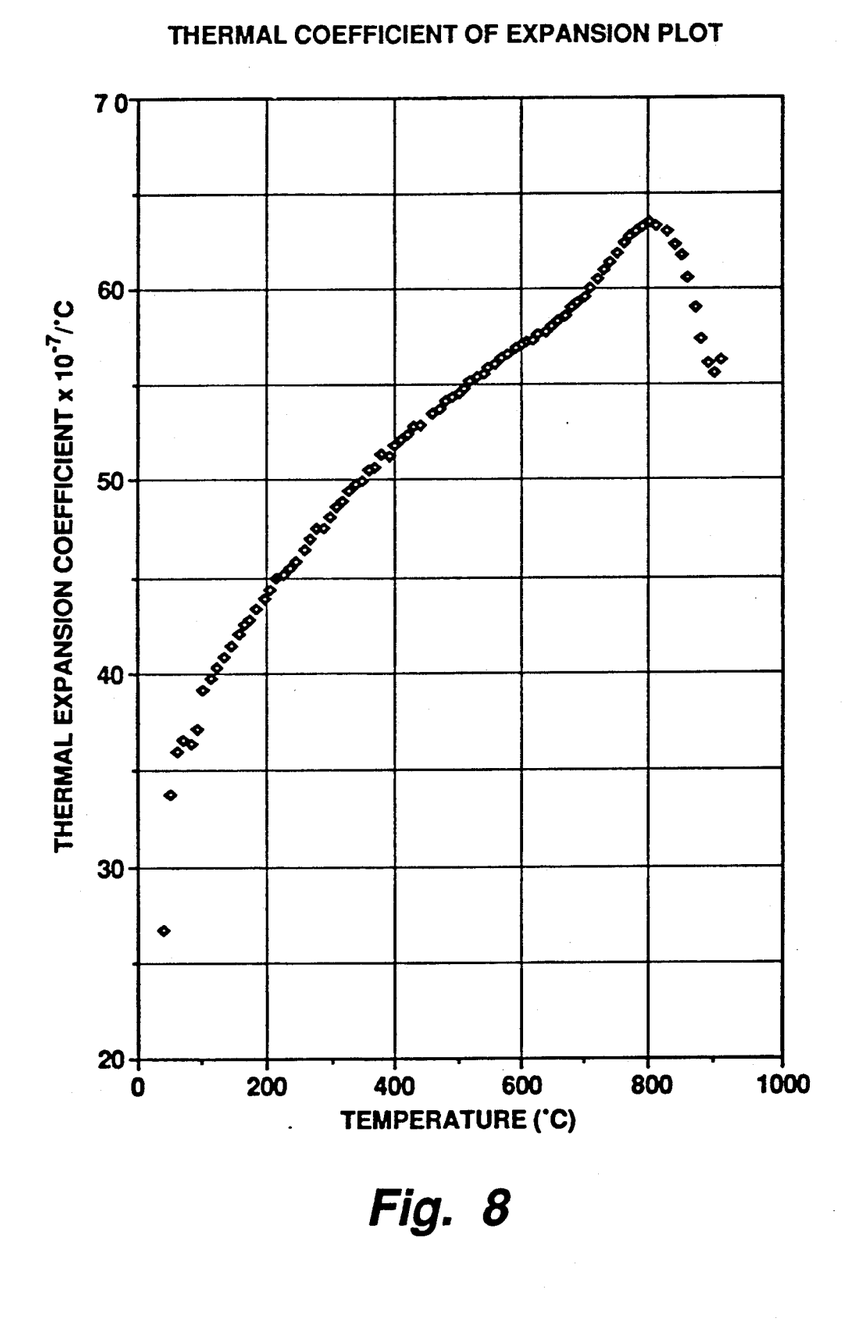
FIG. 8 is a thermal coefficient of expansion plot of an ink of the prior art.

FIG. 8 shows a thermal coefficient of expansion plot of this ink. At 800° C. the coefficient of expansion was about $63 \times 10^{-7}/°$ C. This is significantly below that of alumina.

When this ink was applied to an alumina substrate and fired, the substrate became bent.

I claim:

1. A glass frit composition consisting essentially of from about 5 to about 15% by weight of zinc oxide; from about 10 to about 18% by weight of magnesium oxide; from about 15 to about 20% by weight of calcium oxide; from about 6 to about 14 % by weight of barium oxide; from about 15 to about 20% by weight of aluminum oxide; and from about 30 to about 40% by weight of silicon dioxide.

2. A glass composition according to claim 1 comprising about 10% by weight of zinc oxide; from about 12 to about 14.5% by weight of magnesium oxide; from about 16 to about 18.5% by weight of calcium oxide; about 10% by weight of barium oxide; about 16% by weight of aluminum oxide; and from about 31 to about 36% by weight of silicon dioxide.

3. An overglaze ink composition comprising a glass frit composition consisting essentially of from about 5 to about 15% by weight of zinc oxide; from about 10 to about 18% by weight of magnesium oxide; from about 15 to about 20% by weight of calcium oxide; from about 6 to about 14% by weight of barium oxide; from about 15 to about 20% by weight of aluminum oxide; and from about 30 to about 40% by weight of silicon dioxide and an organic vehicle.

4. An overglaze ink composition according to claim 3 wherein said glass consists essentially of about 10% by weight of zinc oxide; from about 12 to about 14.5% by weight of magnesium oxide; from about 16 to about 18.5% by weight of calcium oxide; about 10% by weight of barium oxide; about 16% by weight of aluminum oxide; and from about 31 to about 36% by weight of silicon dioxide.

5. An alumina substrate having a layer of glass thereon, said glass consisting essentially of from about 5 to about 15% by weight of zinc oxide; from about 10 to about 18% by weight of magnesium oxide; from about 15 to about 20% by weight of calcium oxide; from about 6 to about 14% by weight of barium oxide; from about 15 to about 20% by weight of aluminum oxide; and from about 30 to about 40% by weight of silicon dioxide.

6. An alumina substrate according to claim 5 wherein said glass composition comprises about 10% by weight of zinc oxide; from about 12 to about 14.5% by weight of magnesium oxide; from about 16 to about 18.5% by weight of calcium oxide; about 10% by weight of barium oxide; about 16% by weight of aluminum oxide; and from about 31 to about 36% by weight of silicon dioxide.

7. A printed circuit board comprising an alumina substrate and a layer of glass thereon, said glass consisting essentially of from about 5 to about 15% by weight of zinc oxide; from about 10 to about 18% by weight of magnesium oxide; from about 15 to about 20% by weight of calcium oxide; from about 6 to about 14% by weight of barium oxide; from about 15 to about 20% by weight of aluminum oxide; and from about 30 to about 40% by weight of silicon dioxide.

8. A printed circuit board according to claim 7 wherein said glass comprises about 10% by weight of zinc oxide; from about 12 to about 14.5% by weight of magnesium oxide; from about 16 to about 18.5% by weight of calcium oxide; about 10% by weight of barium oxide; about 16% by weight of aluminum oxide; and from about 31 to about 36% by weight of silicon dioxide.

* * * * *